United States Patent [19]
Cho

[11] Patent Number: 5,281,555
[45] Date of Patent: Jan. 25, 1994

[54] METHOD FOR ALLEVIATING THE STEP DIFFERENCE IN A SEMICONDUCTOR AND A SEMICONDUCTOR DEVICE

[75] Inventor: Myung S. Cho, Seoul, Rep. of Korea

[73] Assignee: Hyundai Electronics Industries Co., Ltd., Rep. of Korea

[21] Appl. No.: 795,671

[22] Filed: Nov. 21, 1991

[30] Foreign Application Priority Data

Nov. 23, 1990 [KR] Rep. of Korea .............. 90-19046

[51] Int. Cl.$^5$ .............................................. H01L 21/44
[52] U.S. Cl. ................................ 437/195; 257/649; 437/52
[58] Field of Search ..................... 437/192-195; 357/71; 257/499, 649

[56] References Cited

U.S. PATENT DOCUMENTS

| | | | |
|---|---|---|---|
| 4,617,730 | 10/1986 | Geldermans et al. | 357/71 |
| 4,916,514 | 4/1990 | Nowak | 257/649 |
| 4,949,162 | 8/1990 | Tamaki et al. | 257/499 |
| 5,032,890 | 7/1991 | Ushika et al. | 257/211 |
| 5,060,045 | 10/1991 | Owada et al. | 357/71 |

FOREIGN PATENT DOCUMENTS

| | | | |
|---|---|---|---|
| 60-4241 | 1/1985 | Japan | 357/71 |
| 60-79744 | 5/1985 | Japan | 357/71 |
| 1-274453 | 11/1989 | Japan | 357/71 |

*Primary Examiner*—Olik Chaudhuri
*Assistant Examiner*—David M. Mason
*Attorney, Agent, or Firm*—Ladas & Parry

[57] ABSTRACT

A method of diminishing a step difference 41 in a multi-layered semiconductor device which comprises determining a location 40 of a step difference 41 on a multi-layered semiconductor device 50 to be formed by utilizing a plurality of conducting layers 35 and a plurality of insulating layers 36 sequentially formed such that the layers are sequentially stacked on a surface of a substrate to form a step difference 41 location 40 on the substrate is disclosed. A conducting layer 3 is deposited on the substrate. A first dummy layer 3C is formed at the step difference location while simultaneously forming a gate electrode 3A and a gate electrode line 3B by performing a mask patterning process. A first insulating layer 5 is deposited on the gate electrode 3A, gate electrode line 3 and the first dummy insulating layer 5A. A second conducting layer 6 is deposited on the first insulating layer 5. A second dummy layer 6B, having a predetermined size to diminish the step difference at the step difference location is formed while simultaneously forming a charge storage electrode 6A by performing a mask patterning process. A second insulating layer 9 is deposited on the resulting structure such that the step difference is diminished to permit overlying layers deposited at the location of the now diminished step difference to be removed without forming a stringer. A semiconductor device which includes the dummy layers is also disclosed.

4 Claims, 3 Drawing Sheets

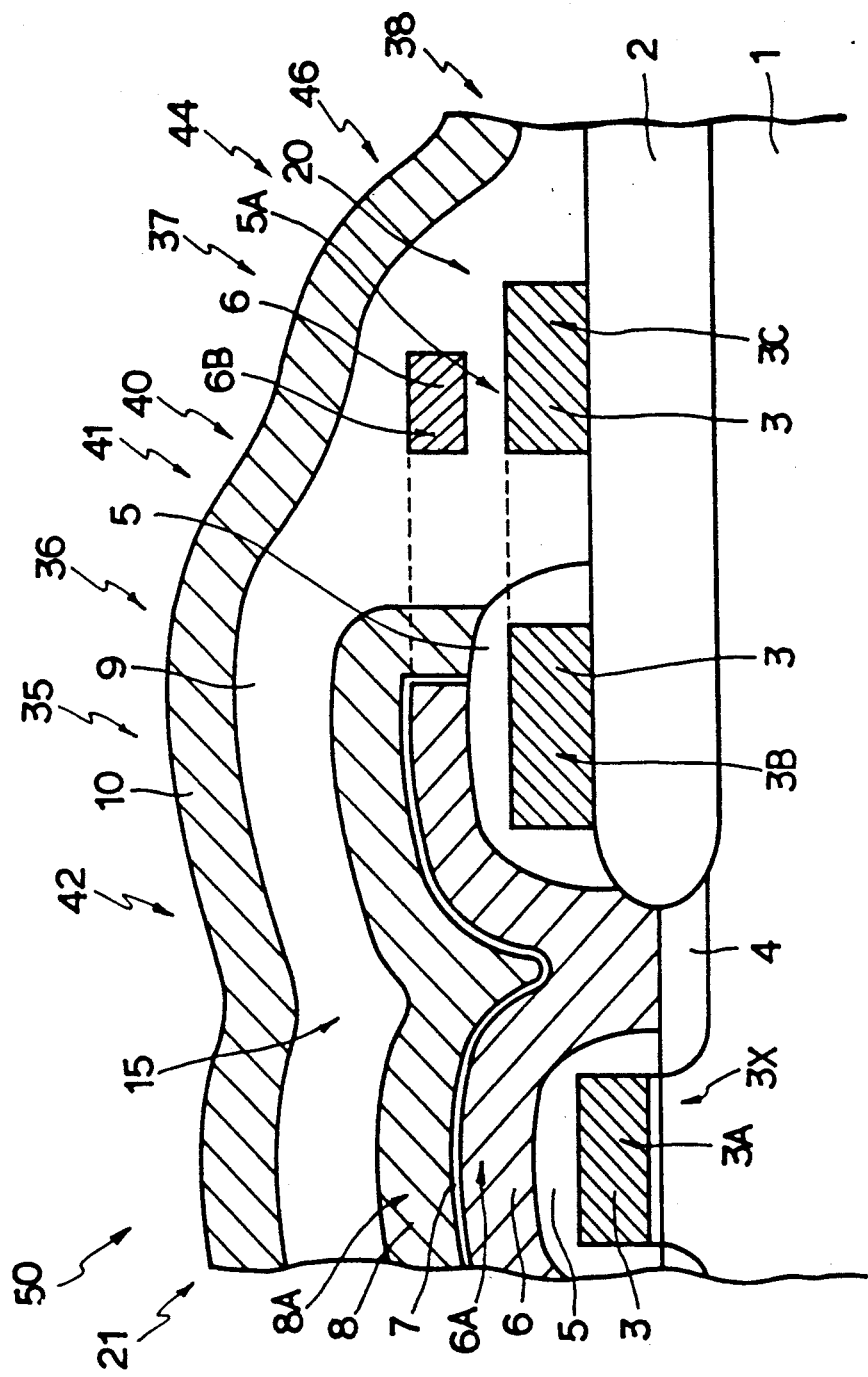

METHOD FOR ALLEVIATING THE STEP DIFFERENCE IN A SEMICONDUCTOR AND A SEMICONDUCTOR DEVICE

BACKGROUND OF INVENTION

1. Field of the Invention

The invention relates to a method for manufacturing a plurality of dummy and insulating layers to control the coverage of a step difference in a multi-layered semiconductor device, and more particularly to a method for providing stacked dummy and insulating layers at a region proximate a structure in the semiconductor device having a step difference in order to diminish the step difference and to a semiconductor device which includes the dummy and insulating layers.

2. Information Disclosure Statement

Generally, as the semiconductor device becomes more highly integrated it becomes a multi-layered structure which includes a plurality of conducting layers, insulating layers, metal layers, or the like, as necessary for its operation. As a result, the structure includes a step difference in its structure. For example, it is assumed that when manufacturing a DRAM 16 semiconductor device, four polysilicon layers and two metal layers are used, as shown in FIG. 1. When an insulating layer 9 is deposited on the resulting structure of a stacked capacitor 15, the step difference 41 occurs at the side of the resulting structure of the stacked capacitor 15. In order to form a bit line electrode 10B, if a portion of the conducting layer 10 for bit line deposited on the resulting insulating layer 9 is etched, as shown in FIG. 2, a stringer 10A, which is a remaining portion of the conducting layer 10, remains on the slope of the resulting insulating layer 9, (T at FIG. 2) which results in a bridge phenomenon in which the stringer 10A is undesirably connected to an adjacent conducting layer (not shown) which is to be deposited thereover. Also, because of the uneven thickness of the deposited conducting layer at the locations of the step differences, a break may occur in the conducting layer which interferes with the operation of the resulting device.

Therefore, it is an object of the invention to solve the problems set forth above and to provide a method for forming a sloped layer comprising a plurality of dummy layers and insulating layers at a location on the semiconductor device having a structure defining a step difference to contour the coverage of the step difference in semiconductor device.

It is a further object of the present invention to provide a semiconductor device which includes dummy layers and insulating layers to contour a step difference therein.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method for alleviating or diminishing the step difference in a semiconductor and the semiconductor device produced thereby of the present invention is defined by the claims with a specific embodiment shown in the attached drawings. For the purpose of summarizing the invention, the invention relates to the method of diminishing a step difference 41 in a multi-layered semiconductor device and comprises determining a location 40 of a step difference 41 on a multi-layered semiconductor device 50 to be formed by utilizing a plurality of conducting layers 35 and a plurality of insulating layers 36 sequentially formed such that the layers are sequentially stacked on a surface of a substrate to form a step difference 41 location 40 on the substrate. A conducting layer 3 is deposited on the substrate, including the location of the step difference. A first dummy layer 3C is formed at the step difference location on the substrate while simultaneously forming a gate electrode 3A and a gate electrode line 3B by performing a mask patterning process of the first conducting layer 3. A first insulating layer 5 is deposited on the gate electrode 3A, gate electrode line 3B and the first dummy insulating layer 5A. A second conducting layer 6 is deposited on the first insulating layer 5 including on the location of the step difference which includes the first dummy layer 3C. A second dummy layer 6B is formed having a predetermined size to diminish the step difference at the step difference location which includes the first dummy layer 3C while simultaneously forming a charge storage electrode 6A by performing a mask patterning process of the second conducting layer 6. A second insulating layer 9 is deposited on the resulting structure including the location of the step difference such that a gradual slope is formed at the location of the step difference diminishing the step difference to permit overlying layers deposited at the location of the now diminished step difference to be removed without forming a stringer.

The method further includes varying the dimensions of the dummy layers to further diminish the step difference.

The present invention further includes a multi-layered semiconductor device comprising a plurality of conducting layers 35 and a plurality of insulating layers 36 sequentially stacked to form a first sequentially stacked layer 42 on a surface 38 of a substrate 30 of the semiconductor device thereby forming a step difference location 40 on the surface 38 of the substrate 30 between the first sequentially stacked layer 42 and the substrate 30. A plurality of dummy layers 37 and a plurality of insulating layers are sequentially stacked at the step difference location 40 to form a second stacked layer 44 which provides a gradual slope 46 at the step difference location thereby diminishing the step difference between the first stacked layer 42 and the surface of the substrate 30.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

FIGS. 3, 4A and 4B are sectional views of a semiconductor device according to the present invention.

Similar reference characters refer to similar parts throughout the several views of the drawings.

DETAILED DESCRIPTION OF THE INVENTION

Figure 1:
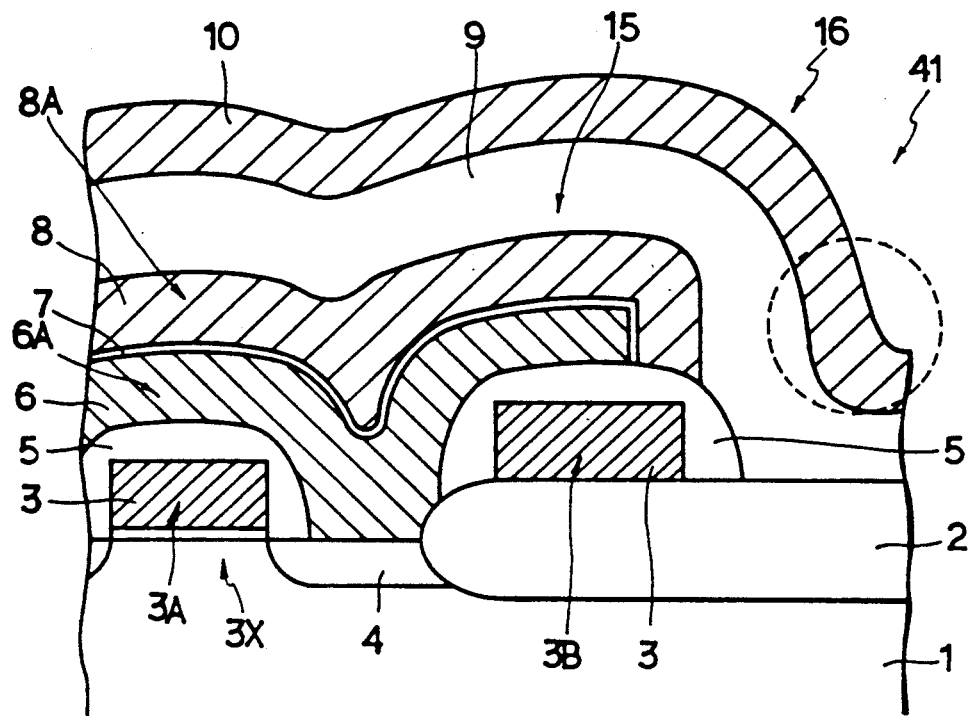
FIG. 1 is a sectional view of the step difference of a semiconductor device of the prior art.

FIG. 1 illustrates a semiconductor device in which a field oxide layer 2 is formed on a portion of the silicon substrate 1, a source electrode and/or drain electrode 4 is formed into the substrate 1 proximate the field oxide layer 2. A first conducting layer 3 is deposited on the entire structure and portions of the first conducting layer 3 are removed by a mask patterning process to form a gate electrode 3A on the substrate 1 and a gate electrode line 3B on the field oxide layer 2. A first insulating layer 5 is deposited on the gate electrode and gate electrode line, to thereby form a MOSFET 3X. A charge storage electrode 6A is then formed on the first insulating layer 5 and on the source electrode 4 by depositing a second conducting layer 6 and removing a portion of the second conducting layer by a mask patterning process of the second conducting layer, to electrically connect it to the source electrode 4, and a capacitive dielectric layer 7 is then deposited thereon. A plate electrode 8A formed with a third conducting layer 8 is then formed on the charge storage electrode 6A on which the capacitive dielectric layer 7 is deposited, thereby forming a stacked capacitor 15 including the charge storage electrode 6A and the plate electrode 8A. A second insulating layer 9 is deposited on the entire surface of the resulting structure including the stacked capacitor, and a bit line conducting layer 10 is sequentially deposited thereon. As a result of this, it can be seen in that a step difference 41 is undesirably produced at the side of the resulting second insulating layer 9, when the stacked capacitor is formed thereunder, as illustrated in the drawing.

Figure 2:
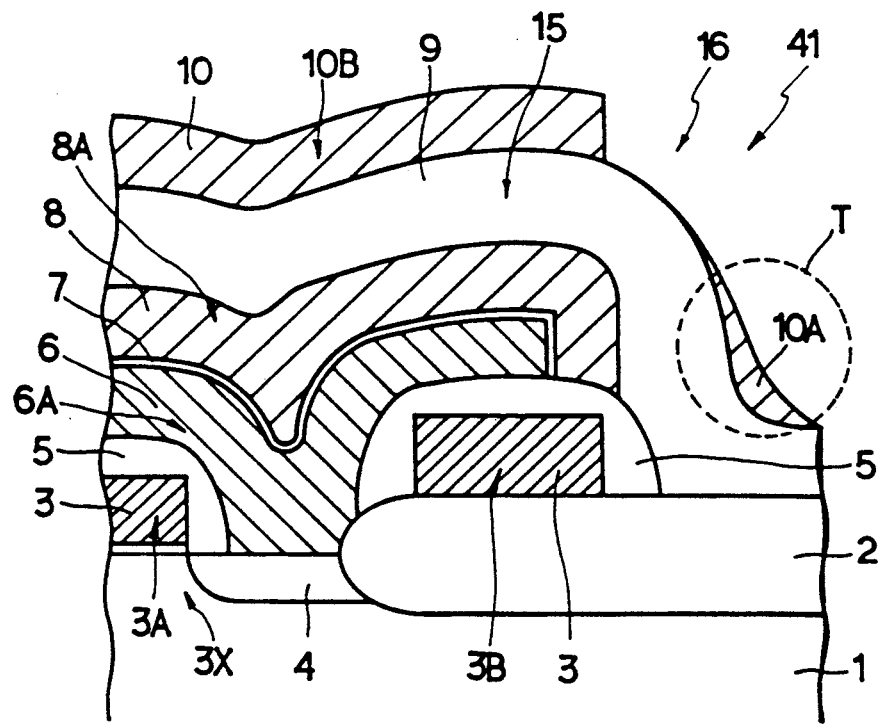
FIG. 2 is a sectional view of the problem brought about by the step difference in the manufacture of the semiconductor device.

FIG. 2 illustrates a DRAM 16 in which a bit line electrode 10B is formed on the second insulating layer 9 by removing a portion of the bit line conducting layer 10 in connection with FIG. 1. Referring to the drawing, when etching the conducting layer 10 to form the bit line electrode 10B, a portion of the conducting layer 10 positioned at the side portion "T" of the second insulating layer 9 is not completely removed, due to the step difference. This results in a stringer 10A (a portion of the insulating layer 10) remaining at the step difference T. This results in the bridge phenomenon between the stringer 10A and a conducting layer (not shown) which is to be deposited later, and also results in the failure of the resulting semiconductor device.

FIG. 3 represents a DRAM according to the present invention, in which a dummy layer 20 is provided at the side portion, which is the portion where the step difference 41 will be located 40 due to the resulting structure of the stacked capacitor 15, as shown in FIG. 2. In order to form the dummy layer 20 at location 40, a first dummy layer 3C is formed simultaneously with forming the gate electrode 3A and gate electrode line 3B by performing a mask patterning process of the first conducting layer 3 which is used to form the gate electrode 3A and gate electrode line 3B. When the first insulating layer 5 is deposited on the gate electrode 3A and gate electrode line 3B, the first dummy insulating layer 5A is also simultaneously deposited on the first dummy layer 3C. Furthermore, a second dummy layer 6B is then formed on the first dummy layer 3C simultaneously forming the charge storage electrode 6A by performing a mask patterning process of the second conducting layer 6 which is used to form the charge storage electrode 6A, thereby defining the dummy layer 20 as illustrated in the drawing. Here it is noted that the width of the second dummy layer 6B is preferably smaller than that of the first dummy layer 3C, in order to alleviate the slope of the resulting second insulating layer which is to be deposited over the resulting structure. In connection with the process described above, the dielectric layer 7 is deposited on the charge storage electrode 6A, and the plate electrode 8A is then formed thereon, thereby forming a stacked capacitor 15 including the charge storage electrode 6A and the plate electrode 8A.

Therefore, if the second insulating layer 9 is deposited on the resulting structure including the stacked capacitor 15 and the dummy layer 20, the step coverage of the deposited second insulating layer 9 can be improved. When a bit line conducting layer 10 is deposited on the resulting second insulating layer 9 the step coverage of which improved, and a portion of the bit line conducting layer 10 is removed to form a bit line electrode, a stringer as mentioned in connection with FIG. 2 does not occur. It is noted that, though not shown in the drawing, the first and second dummy layer 3C and 6A may be connected to the silicon substrate 1 but do not have any electrical function in the semiconductor device.

The method of diminishing the step difference 41 in a multi-layered semiconductor device may be described as first determining the location 40 of an anticipated the step difference 41 on a multi-layered semiconductor device 50 to be formed which utilizes a plurality of conducting layers 35 and a plurality of insulating layers 36 sequentially formed such that the layers are sequentially stacked on a surface of a substrate to form a step difference 41 location 40 on the substrate. Once the location has been determined the step difference 41 can be diminished according to the method of the invention. Thus, a conducting layer 3 is deposited on the substrate including the location of the step difference. A first dummy layer 3C is formed at the step difference location 40 on the substrate while simultaneously forming a gate electrode 3A and a gate electrode line 3B by performing a mask patterning process of the first conducting layer 3. A first insulating layer 5 is deposited on the gate electrode 3A, gate electrode line 3B and the first dummy insulating layer 5A. A second conducting layer 6 is deposited on the first insulating layer 5 including on the location of the step difference which includes the first dummy layer 3C. A second dummy layer 6B having a predetermined size to diminish the step difference is deposited at the step difference location which includes the first dummy layer 3C while simultaneously forming a charge storage electrode 6A by performing a mask patterning process of the second conducting layer 6. A second insulating layer 9 is deposited on the resulting structure including the location of the step difference such that the step difference is diminished to permit overlying layers deposited at the location of the now diminished step difference to be removed without forming a stringer 10A. That is, at the anticipated location of the step difference, a gradual slope 46 exists.

Figure 4A:
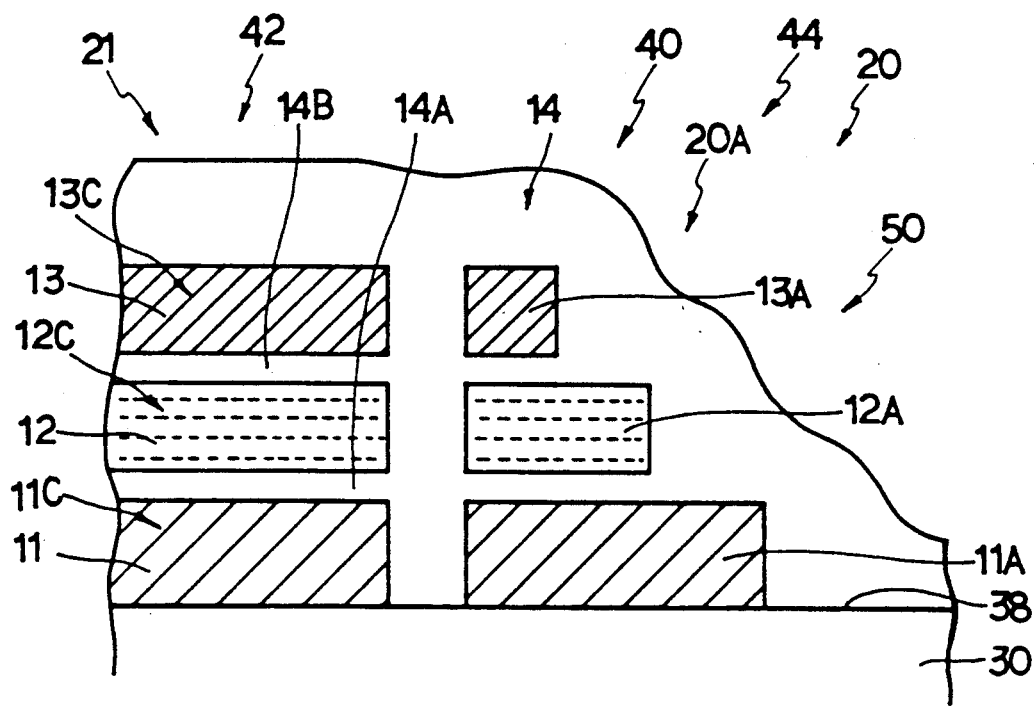
Figure 4B:
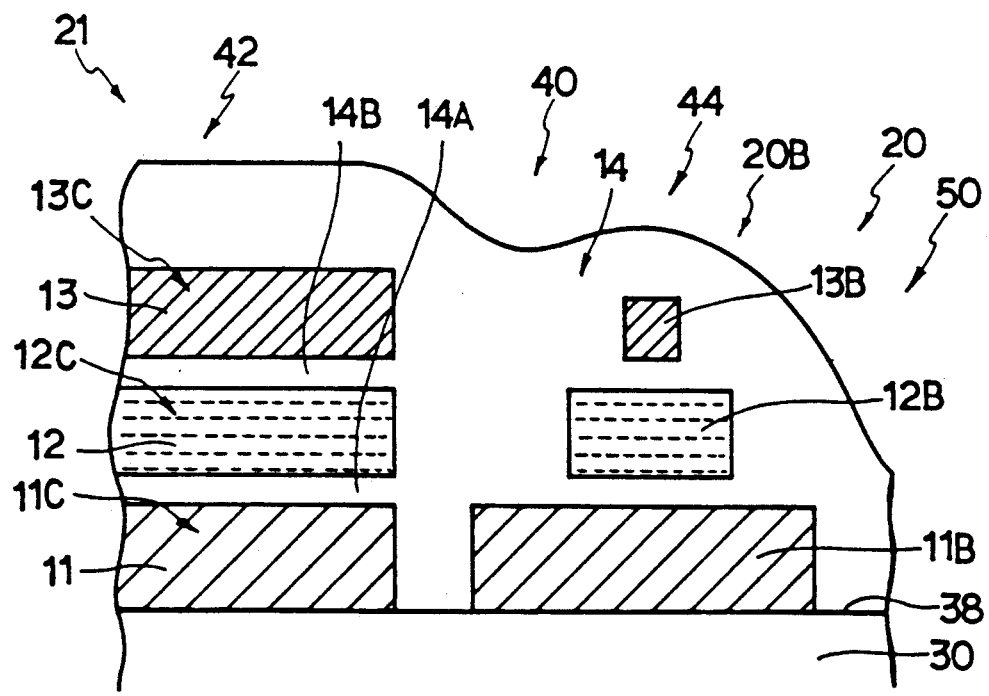

Referring to FIG. 4A and 4B, it is assumed that, in order to form a predetermined semiconductor device, a multi-layered structure 21 comprising a first, second and third electrode 11C, 12C and 13C where each electrodes are insulated relative to each other utilizing a first and second insulating layer 14A and 14B, is provided on a silicon substrate 30. At this time, if an insulating layer 14 is deposited on the resulting multi-layered structure 21, a higher step difference 41 is occurred.

Therefore, according to the invention, in order to prevent the occurrence of the step difference, a plurality of dummy layers 37, such as dummy layers 20A and 20B, and a plurality of insulating layers 36, such as insulating layers 14A, 14B and 14, are provided at the side of the resulting structure as shown in FIGS. 4A and 4B, respectively. The combination of the plurality of dummy and insulating layers defines a second stacked layer 44.

In order to form the dummy layer 20A of FIG. 4A, the first electrode 11C is formed by depositing a first conducting layer 11 on the substrate 30 and removing portions of the first conducting layer 11 by performing a mask patterning process. At this time, a first dummy layer 11A is formed at the side of the structure simultaneously forming the first electrode 11C by performing the same mask patterning process of the first conducting layer 11. A first insulating layer 14A is then deposited to a predetermined thickness on the entire surface of the structure including the first electrode 11 and the first dummy layer 11A, and a second conducting layer 12. A second dummy layer 12A, positioned over the first dummy layer 11A, and the second electrode 12C, positioned over the first electrode 11C, are formed by performing a mask patterning process of the second conducting layer 12. Finally, a second insulating layer 14B is deposited to a predetermined thickness on the entire surface of the resulting structure including the second electrode 12 and the second dummy layer 12A, and a third conducting layer 13 is deposited thereon. A third dummy layer 13A and the third electrode 13C are simultaneously formed on the second dummy layer 12A by performing a mask patterning process of the third conducting layer 13, respectively.

Consequently, when the multi-layered semiconductor device structure is formed, the dummy layer 20A comprising the first, second and third dummy layers can be simultaneously formed therewith so that the otherwise expected step difference caused by depositing the insulating layer 14 on the resulting structure is alleviated.

Referring to FIGS. 4A and 4B, the dummy layers 20A and 20B are formed in a stepped shape and in a pyramidal shape by varying the widths of the first, second and third dummy layers 11C, 12C and 13C, in order to improve the step coverage of the resulting insulating layer 14 deposited thereon. As can be appreciated in connection with above, the profile of the dummy layer can be varied in accordance with the profile, for example, the width or the height of the resulting structure.

As described above, according to the present invention, since the slope of the resulting structure between the higher region and the lower region can be alleviated, the occurrence of the bridge phenomenon caused by the stringer during the manufacturing process of the semiconductor device, as described in the opening paragraph, is prevented and various problems which may occur during the process thereof due to the step difference are avoided.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

I claim:

1. A method of diminishing a multilayer step difference to prevent the formation of a bridge phenomenon at the multilayer step difference, said method comprising:

providing a substrate;

determining a location of a step difference on a multi-layered semiconductor device to be formed by sequentially forming a plurality of conducting layers and a plurality of insulating layers on the substrate such that the layers are sequentially stacked on a surface of the substrate to form a step difference on the substrate, and where at the location of the step difference a conducting layer to be subsequently deposited is to be etched away;

forming a multilayered structure by sequentially performing mask patterning process as a plurality of conducting layers and insulating layers are sequentially stacked and simultaneously forming at least a dummy layer and an insulating layer at the location of the step difference during the sequential formation of the multilayered structure by the mask patterning processes of the plurality of the conducting layers and insulating layers utilized to form the multilayered semiconductor device; and, depositing an insulating layer on the resulting structure including the multilayered structure and the dummy layer, such that the step difference in the resulting structure is diminished to enable a conducting layer to be deposited at the diminished step difference location to be etched away to form a bit line conducting layer without the formation of a stringer, thereby preventing the formation of a bridge phenomenon at the multilayer step difference.

2. The method of claim 1 wherein the dummy layer is formed in a stepped shape by selectively varying the width of the plurality of the stacked conducting layers.

3. The method of claim 1 wherein the dummy layer is formed in pyramidal shape by selectively varying the width of the plurality of the stacked conducting layers.

4. The method of claim 1 wherein the width and the height of the dummy layer is varied depending upon the width and the height of the multi-layered structure.

* * * * *